US008200925B2

(12) United States Patent
Oh et al.

(10) Patent No.: US 8,200,925 B2
(45) Date of Patent: Jun. 12, 2012

(54) DATA MIRRORING IN SERIAL-CONNECTED MEMORY SYSTEM

(75) Inventors: HakJune Oh, Ottawa (CA); William Petrie, Ottawa (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 623 days.

(21) Appl. No.: 12/399,315

(22) Filed: Mar. 6, 2009

(65) Prior Publication Data

US 2010/0115217 A1  May 6, 2010

Related U.S. Application Data

(60) Provisional application No. 61/109,981, filed on Oct. 31, 2008.

(51) Int. Cl.
*G06F 12/00* (2006.01)
*G06F 3/00* (2006.01)
*G06F 13/00* (2006.01)
*G11C 29/00* (2006.01)

(52) U.S. Cl. ............. 711/162; 710/5; 710/33; 711/103; 711/E12.001; 714/763; 714/E11.001

(58) Field of Classification Search ............... 710/5, 33; 711/103, 162, E12.001; 714/763, E11.001
See application file for complete search history.

(56) References Cited

U.S. PATENT DOCUMENTS

| 7,110,400 | B2 * | 9/2006 | Hronik .................... 370/389 |
| 7,463,535 | B2 * | 12/2008 | Choi ..................... 365/189.04 |
| 7,688,652 | B2 * | 3/2010 | Oh ............................ 365/193 |
| 2005/0193179 | A1 | 9/2005 | Cochran et al. |
| 2005/0278494 | A1 | 12/2005 | Hillier et al. |
| 2006/0026349 | A1 | 2/2006 | Gower et al. |
| 2006/0059406 | A1 * | 3/2006 | Micheloni et al. .......... 714/763 |
| 2009/0019323 | A1 * | 1/2009 | Porterfield .................. 714/700 |
| 2009/0021992 | A1 * | 1/2009 | Oh ........................ 365/189.14 |
| 2009/0063786 | A1 * | 3/2009 | Oh ............................ 711/148 |
| 2009/0103374 | A1 * | 4/2009 | Han et al. ............... 365/189.04 |
| 2010/0115217 | A1 * | 5/2010 | Oh et al. ..................... 711/162 |

FOREIGN PATENT DOCUMENTS

| WO | WO 2008/068176 | | 6/2008 |
| WO | WO 2010048711 A1 * | | 5/2010 |

* cited by examiner

*Primary Examiner* — Kevin Ellis
*Assistant Examiner* — Mehdi Namazi

(57) ABSTRACT

A method of data mirroring in a serial-connected memory system between a first and a second memory device. A bypass command is issued to the first memory device, then a write data packet is provided to the first and second memory devices, and then a write data packet command is provided to the first and second memory devices by wherein the write data packet is passed to the second memory device through the first memory device. Mirroring of the write data packet into the first and second memory devices is thereby achieved. ECC (error correction codes) within spare fields provide means for recovering data after failure. The serial-connected memory system is especially useful for implementing SSD (solid-state disk) memory systems.

29 Claims, 18 Drawing Sheets

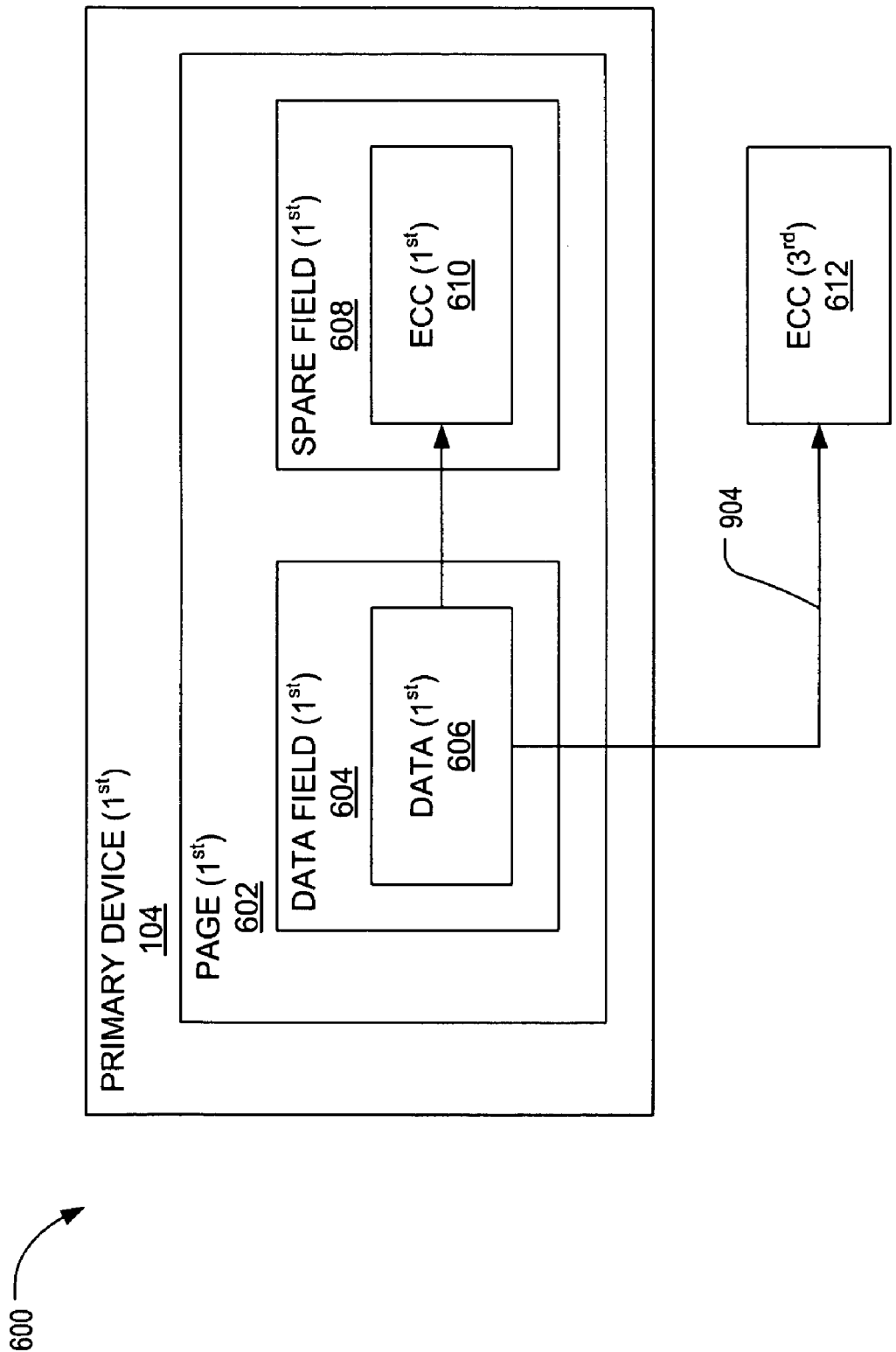

DATA MIRRORING IN SERIAL-CONNECTED MEMORY SYSTEM

CROSS-REFERENCE TO RELATED APPLICATIONS

The present application claims priority from U.S. provisional Patent Application No. 61/109,981, filed Oct. 31, 2008, which is incorporated herein by reference in its entirety.

TECHNICAL FIELD OF THE INVENTION

The invention generally relates to solid state memory systems. More specifically, the invention relates to data mirroring in serial-connected memory system.

BACKGROUND OF THE INVENTION

Solid State Drives (SSD) are becoming popular replacements for conventional hard disk drives (HDD). Non-volatile flash memory is being used to create more rugged and compact devices for the consumer market. These flash memory-based SSDs, also known as flash drives, do not require batteries. They are often packaged in standard disk drive form factors. In addition, non-volatility allows flash SSDs to retain memory even during power outages, ensuring data retrievability. Though flash SSDs are significantly slower than DRAM (dynamic random access memory), they usually perform better than conventional hard drives, at least with regard to reads, because of negligible seek time. Flash-based SSDs have no moving parts, and thus eliminate spin-up time, and greatly reduce seek time, latency, and other delays inherent in conventional electro-mechanical disk drives.

Unlike HDDs though, flash based SSDs have limited P/E (program/erase) cycle life. This limited P/E cycles is even more severe in MLC (Multi-Level-Cell) type NAND flash memories than in SLC (Single Level-Cell). While SLC can be reliable up to about 100,000 P/E cycles for the life time, MLC NAND flash memory can only have about 10,000 P/E cycles. However, because of the great advantage of cost effective higher density in MLC NAND flash, for example, two bit per cell MLC is four times greater than one bit per cell SLC in terms of density. More manufacturers are now producing more MLC NAND flash memory than SLC NAND flash memory. These P/E limits can manifest themselves a block-level write failures or page level read failures.

Since there are reduced number P/E cycles available compared to SLC based SSDs and HDDs, MLC based SSDs require more effective methods for obviating errors compared to SLC based SSDs.

SUMMARY OF THE INVENTION

It is therefore an object of the present invention to provide a memory controller having a flexible data mirroring operation between different memory chips in a serial-connected memory system.

According to one aspect of the present invention there is provided a method of data mirroring in a serial-connected memory system between a first and a second memory device, the method including providing a bypass command to the first memory device, providing a write data packet to the first and second memory devices, and providing a write data packet command to the first and second memory devices. The write data packet is passed to the second memory device through the first memory device. Thereby mirroring the write data packet into the first and second memory devices.

Preferably, providing the bypass command to the first memory device includes enabling a bypass function of the first memory device.

Beneficially, providing the write data packet to the first and second memory devices includes: providing a receive start command to the first memory device; and providing a receive start command to the second device.

Preferably, providing the write data packet to the first and second memory devices includes: receiving the write data packet in the first memory device; bypassing the write data packet through the first memory device; and receiving the write data packet in the second memory device.

Beneficially, receiving the write data packet in the first memory device includes loading the write data packet into a page buffer within the first memory device.

Preferably, receiving the write data packet in the second memory device comprises loading the write data packet into a page buffer within the second memory device.

Beneficially, providing a write data packet command to the first and second memory devices includes: providing a first page program command to the first memory device; and providing a second page program command to the second memory device.

Conveniently, the method further includes: checking a status of the first page program command; and checking a status of the second page program command.

Optionally, the method further includes disabling the bypass function of the first memory device.

According to another aspect of the invention there is provided a memory system including a plurality of serial-connected memory devices which include a first memory device and a second memory device, and a memory controller for providing a bypass command to the first memory device, providing a write data packet to the first memory device and bypassing the write data packet to the second memory device by passing the write data packet through the first memory device, and providing a write command to the first and second memory devices for mirroring the write data packet written in the first second memory device in the second memory device.

Beneficially, the plurality of serial-connected memory devices and the memory controller comprise a daisy-chain topology.

Alternatively, the plurality of serial-connected memory devices and the memory controller comprise a ring topology.

Advantageously, each of the serial-connected memory devices includes: a first link for inputting one or more packets into the memory device; a first input for inputting a command strobe signal into the memory device, the command strobe signal for delineating a first packet input into the memory device by the first data link, the first packet containing a command for executing by the memory device; a second input for inputting a data strobe signal into the memory device, the data strobe signal for delineating a second packet input into the memory device by the first data link, the second packet containing data for storing in the memory device; a first output for outputting the command strobe signal from the memory device; a second output for outputting the data strobe signal from the memory device; and a second link for: outputting the first packet from the memory device while the command strobe signal is output from the memory device at the output, and outputting the second packet from the memory device while the data strobe signal is output from the memory device at the output.

Beneficially, the bypass command includes: a mode register set command for setting a bypass mode of the first memory device; a first burst data load command for setting a column address of the first memory device; and a second burst data load command for setting a column address of the second memory device.

Advantageously, the first and second memory devices each include a page buffer for receiving the write data packet.

Beneficially, the write command includes: a first page program command for setting a row address of the first memory device; and a second page program command for setting a row address of the second memory device.

According to yet another aspect of the invention there is provided a solid-state disk drive including a plurality of serial-connected memory devices which include a first memory device and a second memory device, and a memory controller for providing a bypass command to the first memory device, providing a write data packet to the first memory device and bypassing the write data packet through the first device to the second memory device, and providing a write command to the first and second memory devices for mirroring the write data packet written in the first second memory device in the second memory device.

Beneficially, the memory controller further includes means for providing an interface between the plurality of serial-connected memory devices and an external apparatus.

Advantageously, a type of the interface of the solid-state disk drive is may be any one of: USB (Universal Serial Bus), SD (Secure Digital), CF (Compact Flash), or AHCI (Advanced Host Controller Interface).

Beneficially, a format of the solid-state disk drive is chosen from a list consisting of: FAT (File Allocation Table), NTFS (New Technology File System), JFFS (Journaling Flash File System), YAFFS (Yet Another Flash File System), and ZFS (Zettabyte File System).

According to still another aspect of the invention there is provided a method of reading in a serial-connected memory system having at least a first memory device including data within a first data field within a first page and a first error correction code (ECC) within a first spare field within the first page, a second memory device including data within a second data field within a second page and a second ECC within a second spare field within the second page, and wherein the data within the second data field is a mirrored version of the data within the first data field, the method including reading the first page from the first memory device, generating a third ECC from the data within the first data field, comparing the first ECC with the third ECC, reading the second page from the second memory device, generating a fourth ECC from the data within the second data field, and comparing the second ECC with the fourth ECC.

Advantageously, the method further includes: comparing the second ECC with the third ECC.

Beneficially, the method further includes: comparing the first ECC with the fourth ECC.

Advantageously, the method further includes: comparing the third ECC with the fourth ECC.

Beneficially, the method further includes: correcting the data within the first data field using the first ECC.

Advantageously, the method further includes: correcting the data within the second data field using the second ECC.

Beneficially, the method further includes: correcting the data within the first data field using the second ECC.

Advantageously, the method further includes: correcting the data within the second data field using the first ECC.

Beneficially, further include: bitwise comparing the data from the first data field with the data from the second data field; generating a third data field by inverting a bit of the data from the first or second data field corresponding to the bitwise comparison; generating a fifth ECC from the third data field; and comparing the fifth ECC with the first or second ECC.

The present invention therefore provides a method and apparatus for improved data mirroring implementing a serial high speed serial link, thereby providing a memory controller having a flexible data mirroring operation between different memory chips in a serial-connected memory system.

BRIEF DESCRIPTION OF THE DRAWINGS

Further features and advantages of the present invention will become apparent from the following detailed description, taken in combination with the appended drawings, in which:

FIG. 6 is a block diagram of the primary device shown in FIG. 1 and a third error correction code (ECC);

It will be noted that throughout the appended drawings, like features are identified by like reference numerals.

DESCRIPTION OF EMBODIMENTS

Figure 1:
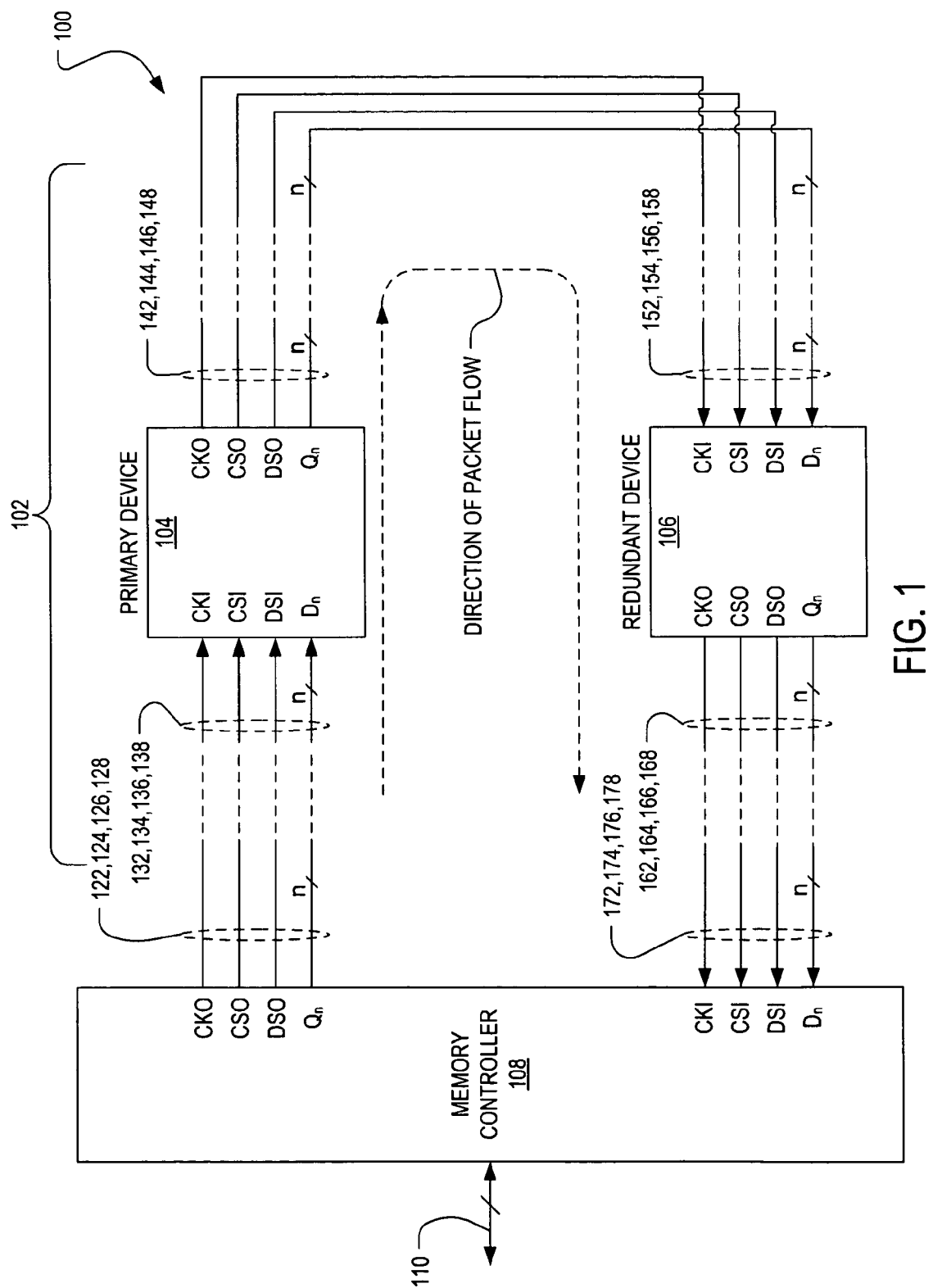
FIG. 1 is a block diagram of a memory system including a plurality of serial-connected memory devices in accordance with an embodiment of the present invention.

Referring first to FIG. 1, there is shown a memory system 100 of an embodiment of the present invention including a plurality of serial-connected memory devices 102. For clarity, only two devices are shown. However, the system 100 may include any number of memory devices having compatible interfaces. The memory system 100 includes at least one first or primary device 104 for storing data, and a second or redundant device 106 for backing up or mirroring the data in the primary device 104 as described herein below. The primary device 104 and secondary device 106 are preferably identical for taking advantage of economies of scale, but may be different and still be within the invention. Also, even though only one set of primary and redundant devices are shown in FIG. 1, multiple sets of primary and redundant devices can be included in the plurality of serial-connected memory devices 102 and still be within the invention.

A memory controller 108 acts as a master chip in a serial-connected configuration or topology for providing commands and data to the plurality of memory devices 102 as well as receiving data from the plurality of memory devices 102. The memory controller 108 also preferably provides an external interface 110 which may be, for example, a USB (Universal Serial Bus), SD (Secure Digital), CF (Compact Flash), AHCI (Advanced Host Controller Interface) interface or the like. The memory system 100 can provide a computer or other apparatus, such as a digital camera, audio player or the like (not shown), means for storing data in a file system format such as, for example, FAT (File Allocation Table), NTFS (New Technology File System), JFFS (Journaling Flash File System), YAFFS (Yet Another Flash File System), ZFS (Zettabyte File System) or the like. Such means may be referred to as a SSD (Solid State Drive).

The memory controller 108 provides a plurality of signals including a clock output (CKO) 122, a command strobe output (CSO) 124, a data strobe output (DSO) 126, and a data output ($Q_n$) 128. These signals may be directly connected to or flow through one or more memory devices (not shown) to respective inputs: clock input (CKI) 132, command strobe input (CSI) 134, data strobe input (DSI) 136, and data input ($D_n$) 138 on the primary device 104. The primary device 104 provides respective output signals: clock output (CKO) 142, command strobe output (CSO) 144, data strobe input (DSO) 146, and data output ($Q_n$) 148. These signals may be directly connected to or flow through one or more memory devices (not shown) to respective inputs: clock input (CKI) 152, command strobe input (CSI) 154, data strobe input (DSI) 156, and data input ($D_n$) 158 on the redundant device 106. The redundant device 106 provides respective output signals: clock output (CKO) 162, command strobe output (CSO) 164, data strobe input (DSO) 166, and data output ($Q_n$) 168. These signals may be directly connected to or flow through one or more memory devices (not shown) to respective inputs: clock input (CKI) 172, command strobe input (CSI) 174, data strobe input (DSI) 176, and data input ($D_n$) 178 on the memory controller 108.

The CKI 132,152,162 signals are input clock signals for latching respective CSI 134,154,174, DSI 136,156,176, and $D_n$ 138,158,178 signals preferably on a rising edge of the CKI 132,152,162 signals.

The CKO 122,142,162 signals are output clock signals which are delayed or phase-locked versions of respective CKI 132,152,162 signals. The CSO 124,144,164, DSO 126,146, 166, and $Q_n$ 128,148,168 signals are referenced to the rising edges of respective CKO 122,142,162 signals.

The $D_n$ 138,158,178 signals are data input signals for receiving command, address, and input data preferably encapsulated in a packet format.

The $Q_n$ 128,148,168 signals are data output signals for transmitting output data during read operations or bypass command, address or input data received on respective $D_n$ 138,158,178 signals.

The data output signals ($Q_n$) 128,148,168 and data input signals ($D_n$) 138,158,178 may be a fixed width or a programmable width (n) as described in common assignee's co-pending application titled: "MEMORY SYSTEM AND METHOD WITH SERIAL AND PARALLEL MODES", Ser. No. 11/637,175, filed on Dec. 12, 2006, by Pyeon et al. which is incorporated herein by reference.

The CSI 134,154,174 signals are command strobe inputs for latching command and address inputs through respective $D_n$ 138,158,178.

The CSO 124,144,164 signals are command strobe output signals which are echo signals of respective CSI 134,154,174 signals. The CSO 124,144,164 signals bypass the respective CSI 134,154,174 signal transitions preferably with one clock cycle latency referenced to the rising edges of respective CKO 122,142,162 signals.

The DSI 136,156,176 signals are data strobe input signals. If a DSI 136,156,176 signal is HIGH while a respective device 104,106,108 is in a read mode, it enables a read data output path and a respective $Q_n$ 128,148,168 signal buffer. If a DSI 136,156,176 signal is LOW, the respective $Q_n$ 128,148, 168 signal buffer holds the previous data accessed. If a DSI 136,156,176 signal is HIGH while the respective device 104, 106,108 is in a write mode, it enables a respective $D_n$ 138, 158,178 signal buffer and a write data input path.

The DSO signals 126,146,166 are data strobe output signals which are echo signals of respective DSI 136,156,176 signals. The DSO signals 126,146,166 bypass the respective DSI 136,156,176 signal transitions preferably with one clock cycle latency referenced to the rising edges of respective CKO 122,142,162 signals.

Even though all of the signals in FIG. 1 and other figures described herein below are shown as single-ended or non-differential signals for convenience and clarity, any of the signals may be implemented as differential signals and still be within the scope of the invention. Persons skilled in the art will also appreciate that power and ground connections are not shown for clarity but are implemented in a conventional manner.

Methods for reading, writing, storing, and retrieving data to/from a memory device such as the primary 104 and secondary 106 devices and using a memory controller 108 shown in FIG. 1 are further disclosed in common assignee's co-pending U.S. patent application titled: "MEMORY WITH DATA CONTROL", Ser. No. 11/779,587, filed on Jul. 18, 2007, by Oh, which is incorporated herein by reference.

Figure 2:
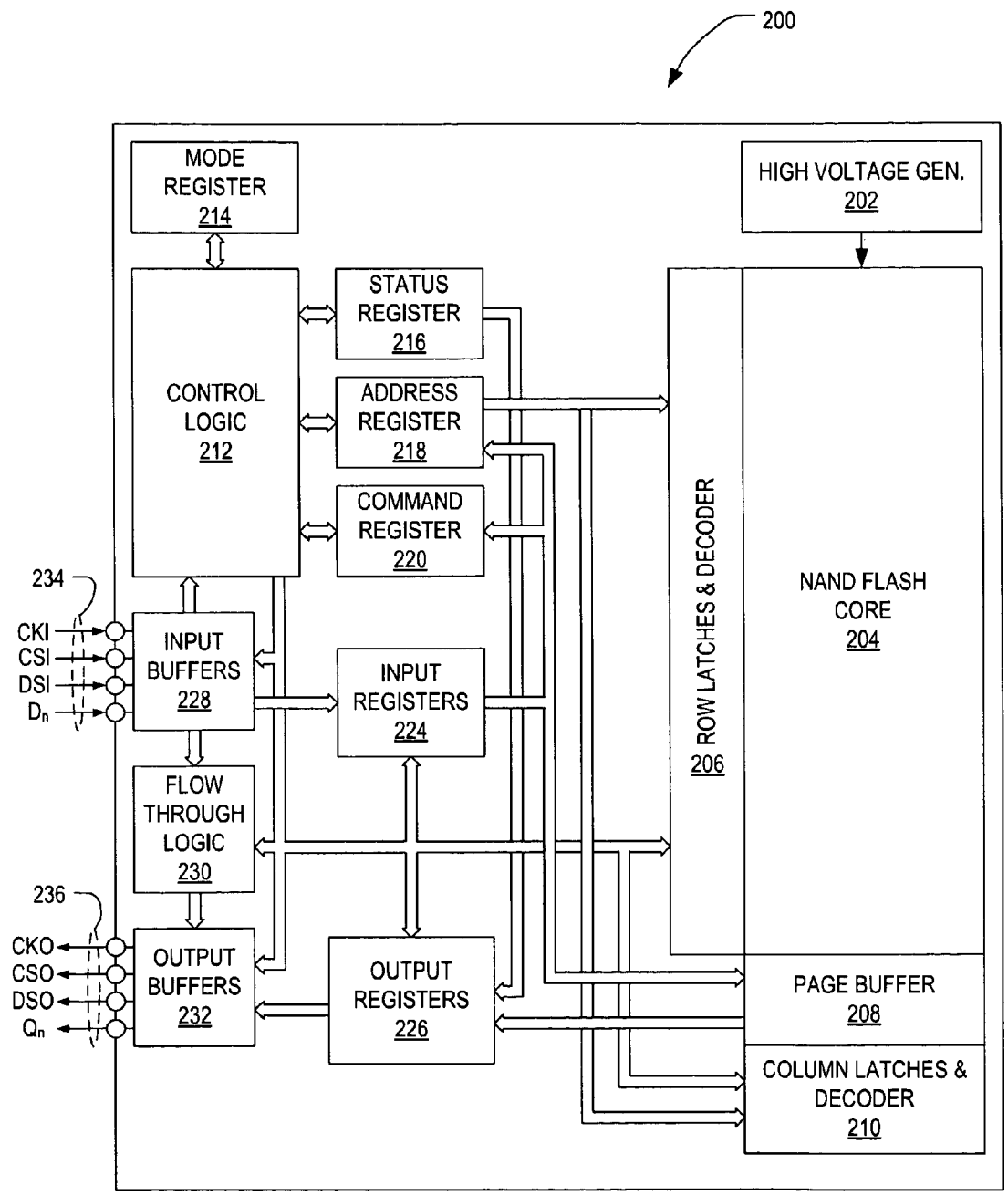
FIG. 2 is a block diagram of the memory devices shown in FIG. 1.

FIG. 2 is a block diagram of an embodiment of a memory device 200 that may be used to implement the primary device 104 and the redundant device 106 shown in FIG. 1. The memory device 200 includes various circuitry arranged for storing and retrieving data in response to commands that are input into the memory device 200. More specifically, memory device 200 includes a high voltage generator 202, a NAND Flash core memory 204, row latches and decoder 206, page buffer 208, column latches and decoder 210, control logic 212, a mode register 214, a status register 216, address register 218, command register 220, input registers 224, output registers 226, input buffers 228, flow through logic 230, and output buffers 232.

The NAND Flash core 204 may be a single bank of flash cell arrays or it could be multiple banks of flash cell arrays may be a single bank of flash cell arrays or it may be multiple banks of flash cell arrays.

The row latches and decoder 206 performs final decoding procedure for the given and pre-decoded row addresses.

The column latches and decoder 210 performs final decoding procedure for the given and pre-decoded column addresses.

The page buffer 208 performs sensing and amplifying operations for each of bit-lines from the NAND Flash Core 204, and temporarily stores sensed data or latches and temporarily stores input data information as well.

The high voltage generator 202 includes circuitry arranged to generate various voltage levels used by various circuitry contained in the memory device 200.

The Mode Register 214 (Table 1) stores a plurality of programmable mode settings, and one of modes implemented here is the BYPASS mode described herein below.

TABLE 1

Byte Definition for Mode Register 214

| Configuration | | Bit | | | | | | | |
|---|---|---|---|---|---|---|---|---|---|
| | | 7 | 6 | 5 | 4 | 3 | 2 | 1 | 0 |
| Bypass of Write Data Packet (Default = Disable) | Disable Enable | | | | | | | | 0 1 |
| RFU | | | | | All Other Combination | | | | |

The input buffers 228 receive input signals CKI, CSI, DSI, and $D_n$ 234, and Output Buffers provide output signals CKO, CSO, DSO and $Q_n$ 236.

Between the input buffers 228 and output buffers 232, there is a flow-through logic block 230 for bypassing incoming command and address packets regardless of a value in the mode register 214 and selectively bypassing based on the value data in the mode register 214 as described herein below.

It should be noted that even though the embodiments described herein include ring or loop serial-connected configurations, daisy-chain configurations are also within the scope of the invention.

Figure 3:
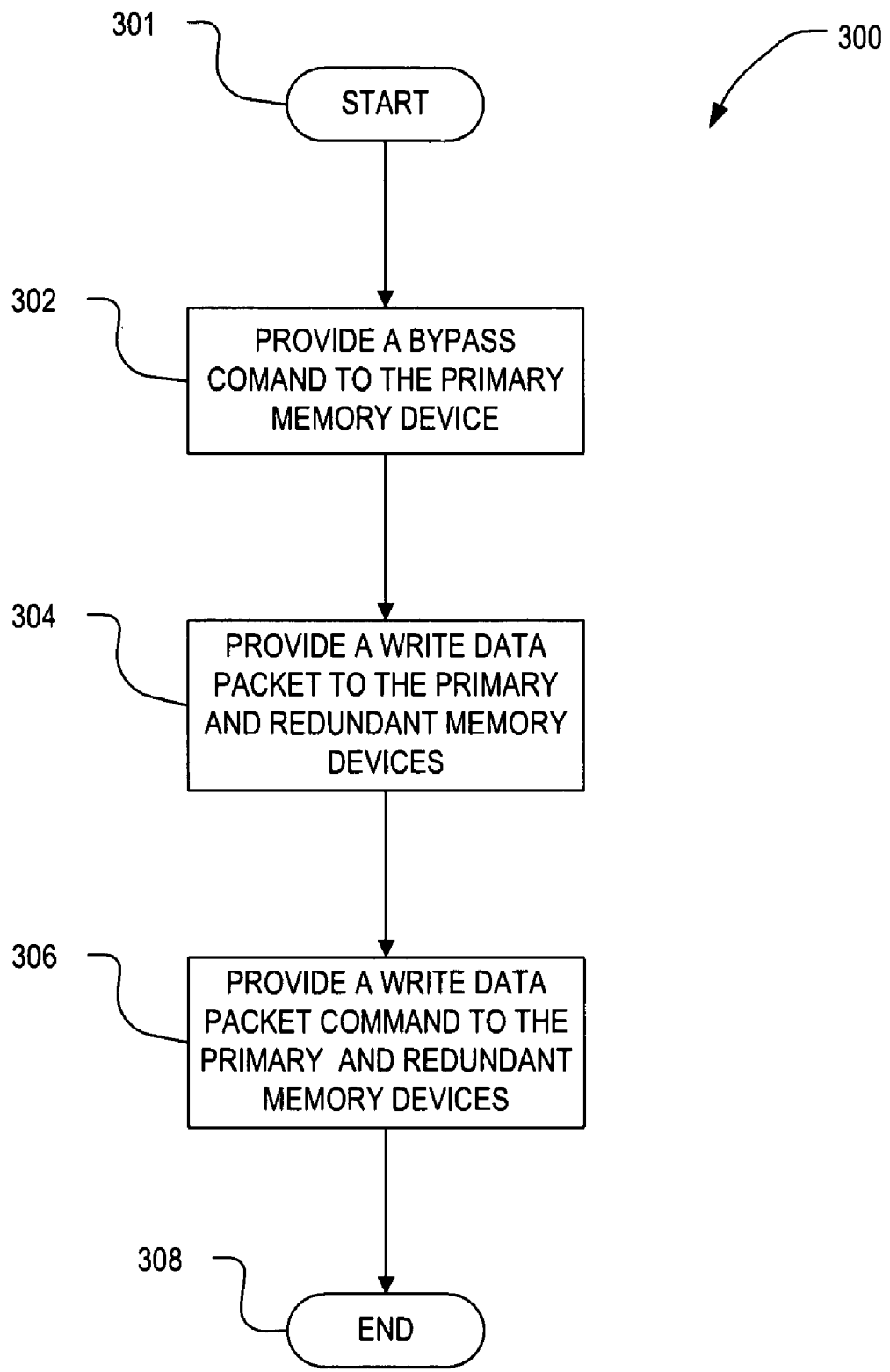
FIG. 3 is a flowchart of a method of data mirroring using the memory system shown in FIG. 1.

Referring now to FIG. 3, there is shown a flowchart 300 of a method of data mirroring in accordance with an embodiment of the present invention. Upon start 301, firstly 302, the memory controller 108 provides a bypass command to the primary memory device 104. Secondly 304, the memory controller 108 provides a write data packet to the primary device 104 and to the redundant device 106 by passing through the write data packet through the primary device 104. Thirdly 306, the memory controller 108 provides a write data packet command to the primary 104 and redundant 106 memory devices, and the method ends 308.

Figure 4A:
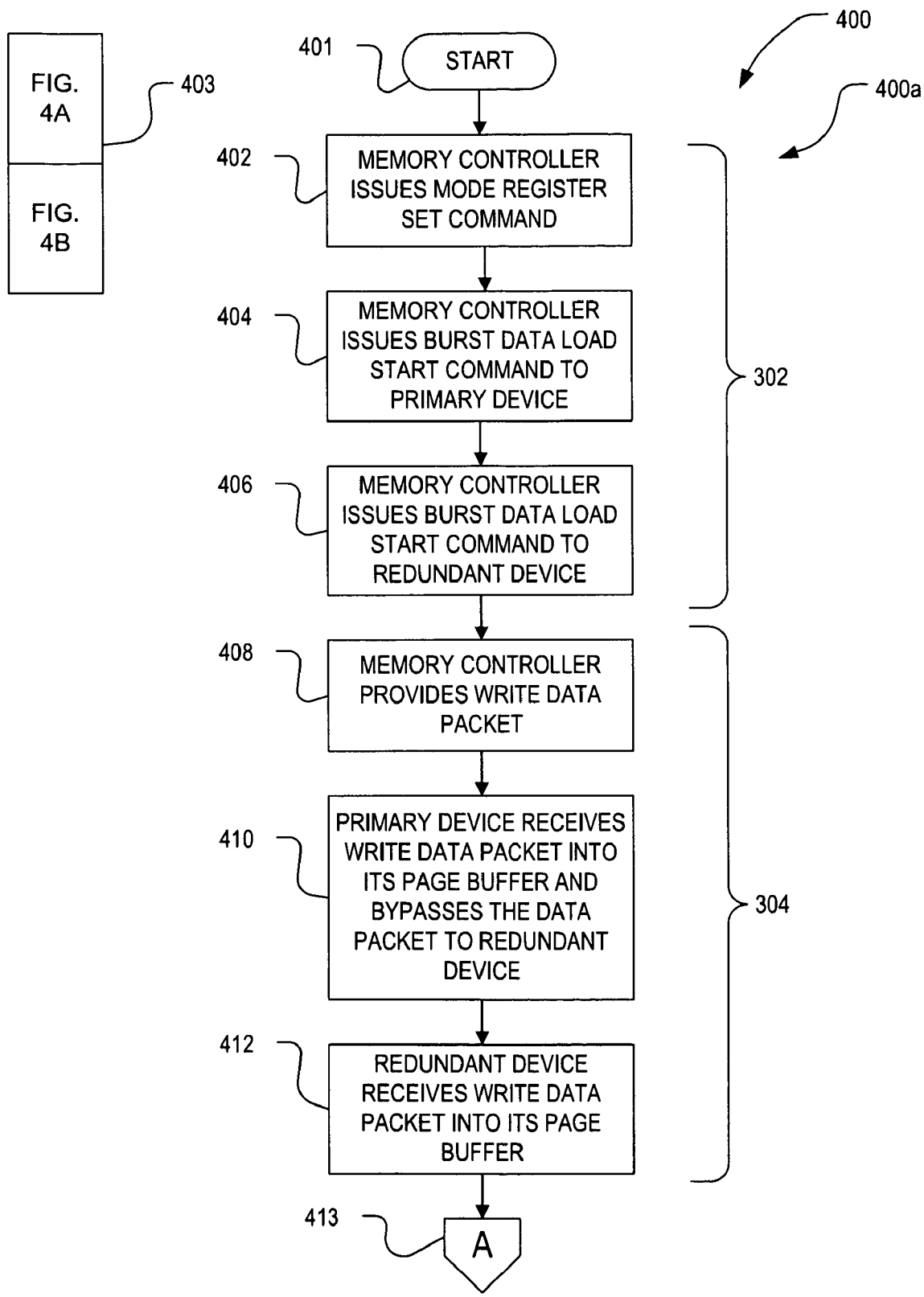
FIG. 4A is a first section of an expanded version of the flowchart of FIG. 3.
Figure 4B:
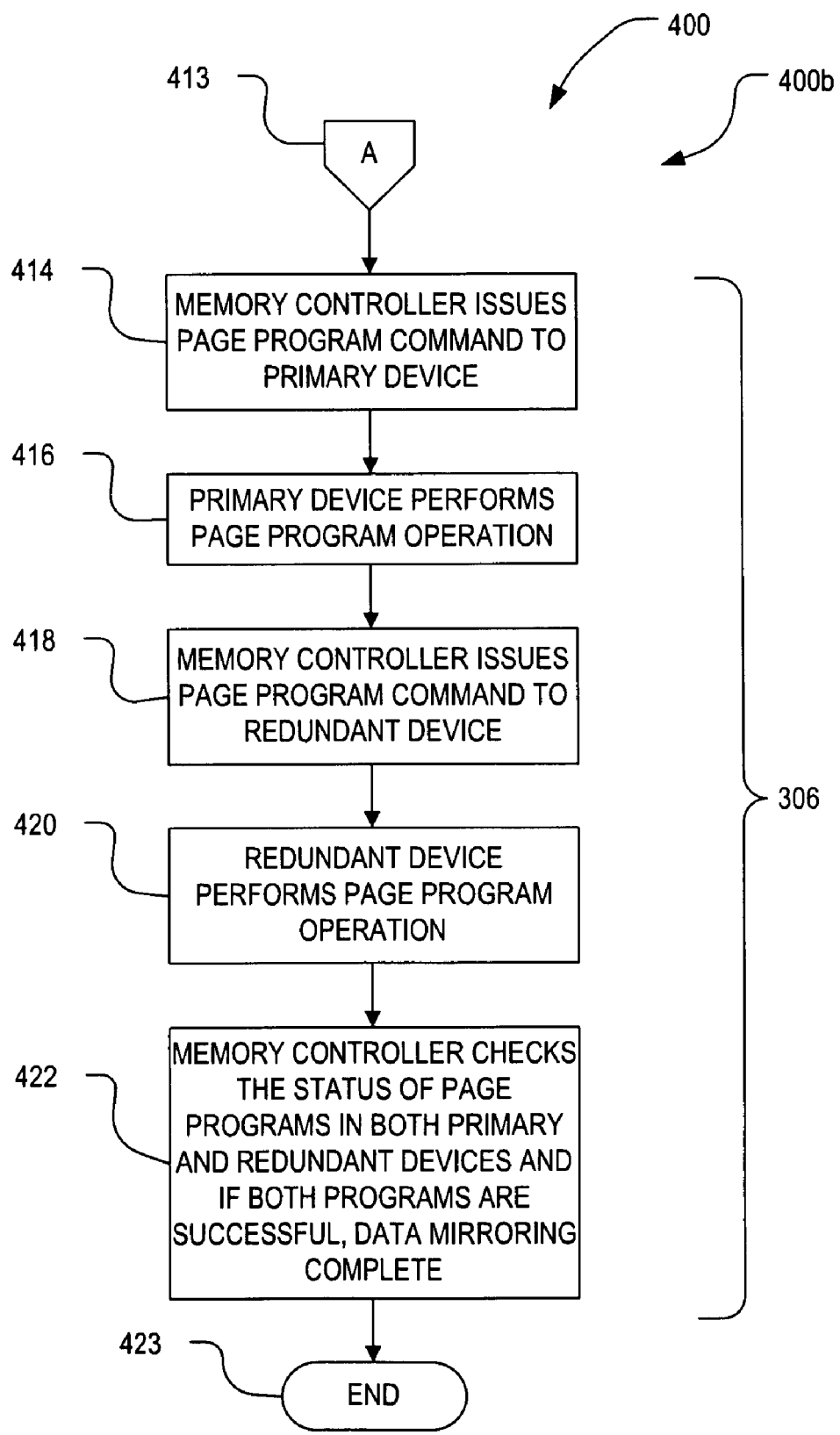
FIG. 4B is a second section of the expanded version of the flowchart of FIG. 3.

The method 300 described in FIG. 3 will now be described in more detail referring to a flowchart 400 shown in FIGS. 4A and 4B. A first section 400a of the flowchart 400, which is shown in FIG. 4A, is logically connected to a second section 400b, which is shown in FIG. 4B, at a connector A 413. A legend 403 in FIG. 4A shows an arrangement of the first 400a and second 400b sections of the flowchart 400.

Upon startup 401, the first step 302 includes steps 402, 404 and 406. In the step 402 the memory controller 108 issues a MODE REGISTER SET command in order to enable bypass function of the target primary memory device 104. This bypass function is set as disabled in default mode for power saving purposes. For this data mirroring operation, the primary memory device 104 is preferably set as bypass enabled in order to bypass its WRITE DATA PACKET for passing through to the redundant memory device 106.

The next step 404, the memory controller 108 issues a BURST DATA LOAD START command to the primary device 104. The primary memory device 104 enters into write mode and can be prepared to receive the write data packet.

In the next step 406, the memory controller issues another BURST DATA LOAD START command packet for the redundant chip 106. After a predetermined number of clock cycles, the redundant device 106 receives the command packet and enters in to write mode.

The second step 304 includes steps 408, 410 and 412. In the step 408, the memory controller 108 issues the WRITE DATA PACKET which is data. Preferably the data includes a data field and a spare field. The spare field preferably stores an error correction code (ECC) generated from the data field as will be described further herein below with reference to FIGS. 6 and 7.

In the next step 410 the primary memory device 104 receives the write packet into its page buffer 208 and bypasses the write data packet.

In the third step 306 includes steps of 414, 416, 418, 420 and 422. In step 412 the redundant memory device 106 receives the write data packet and stores the received write data packet in its own page buffer 208 with the received write data packet.

In the step 414 the memory controller 108 issues a PAGE PROGRAM command to the primary memory device 104.

In step 416 the primary device 104 performs a page program operation.

In step 418 the memory controller 108 issues a PAGE PROGRAM command to the redundant memory device 106.

In step 420 the redundant device performs a page program operation.

In step 422 the memory controller 108 checks whether the page programs in both primary 104 and redundant 106 memory devices are successfully completed, if so, the data mirroring operation is complete 423. The memory controller 108 will be able to access the written data in both devices 104, 106.

Figure 5A:
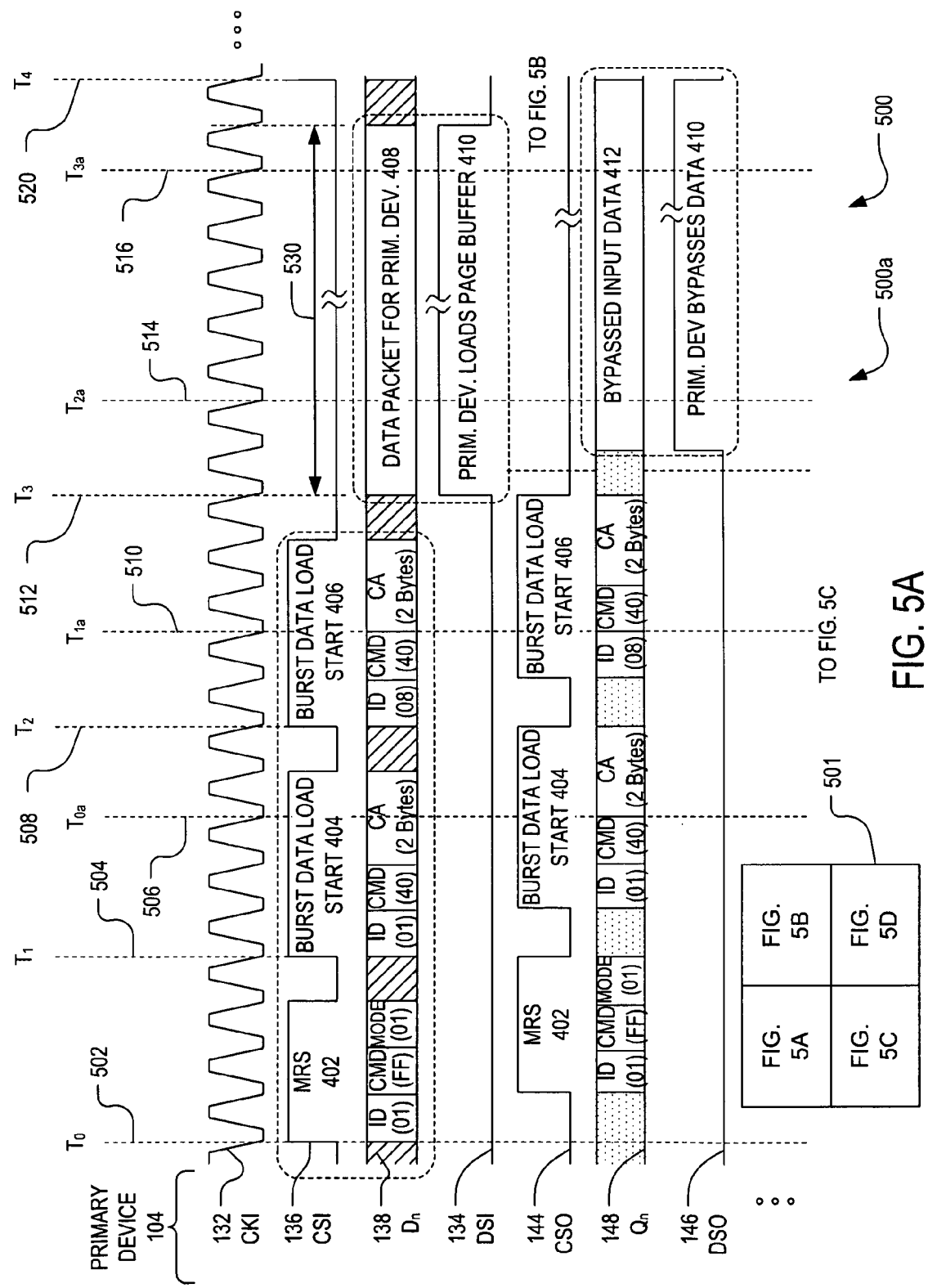
FIG. 5A is a first section of a timing diagram a data mirroring operation using the memory system shown in FIG. 1.
Figure 5B:
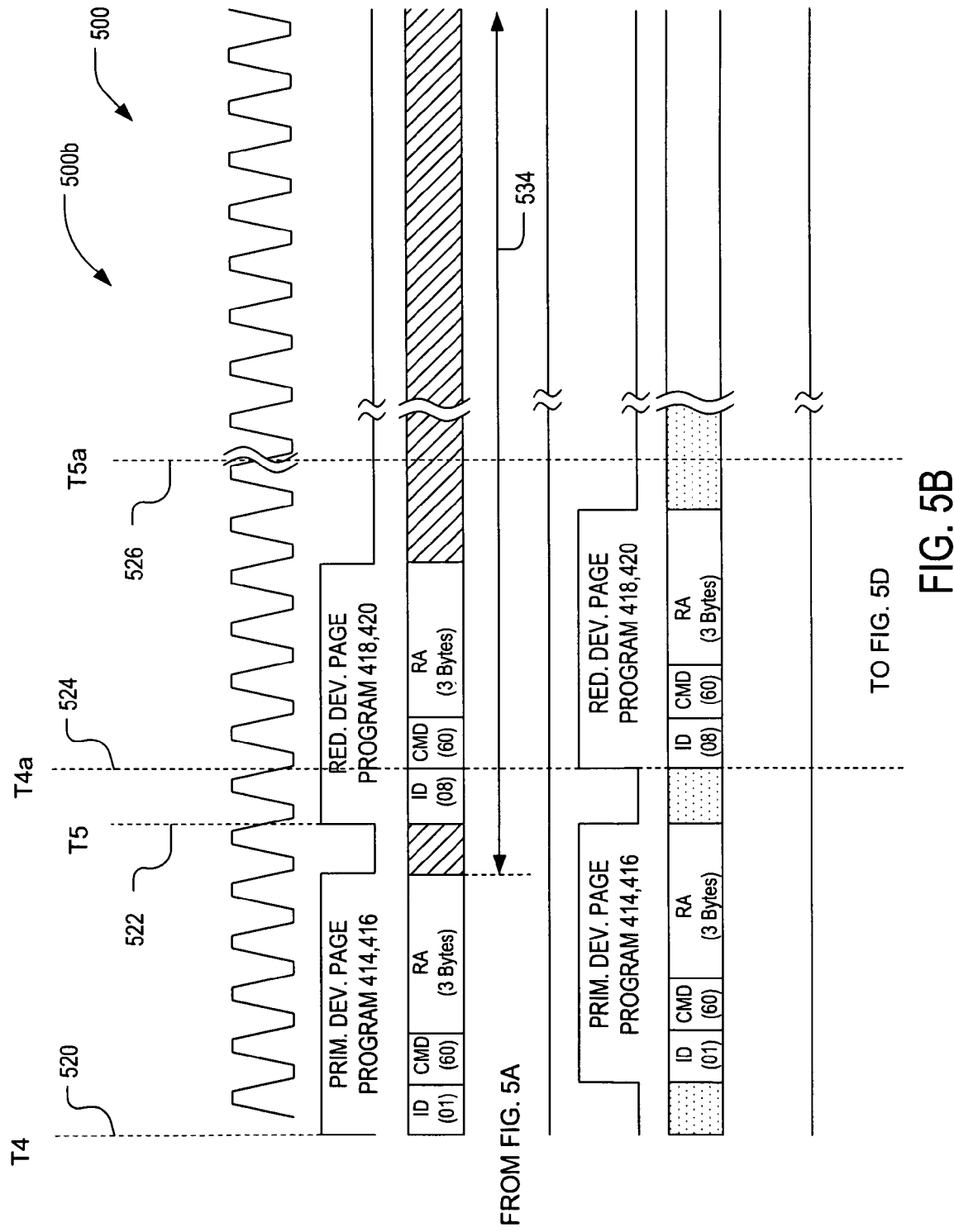
FIG. 5B is a second section of a timing diagram the data mirroring operation using the memory system shown in FIG. 1.
Figure 5C:
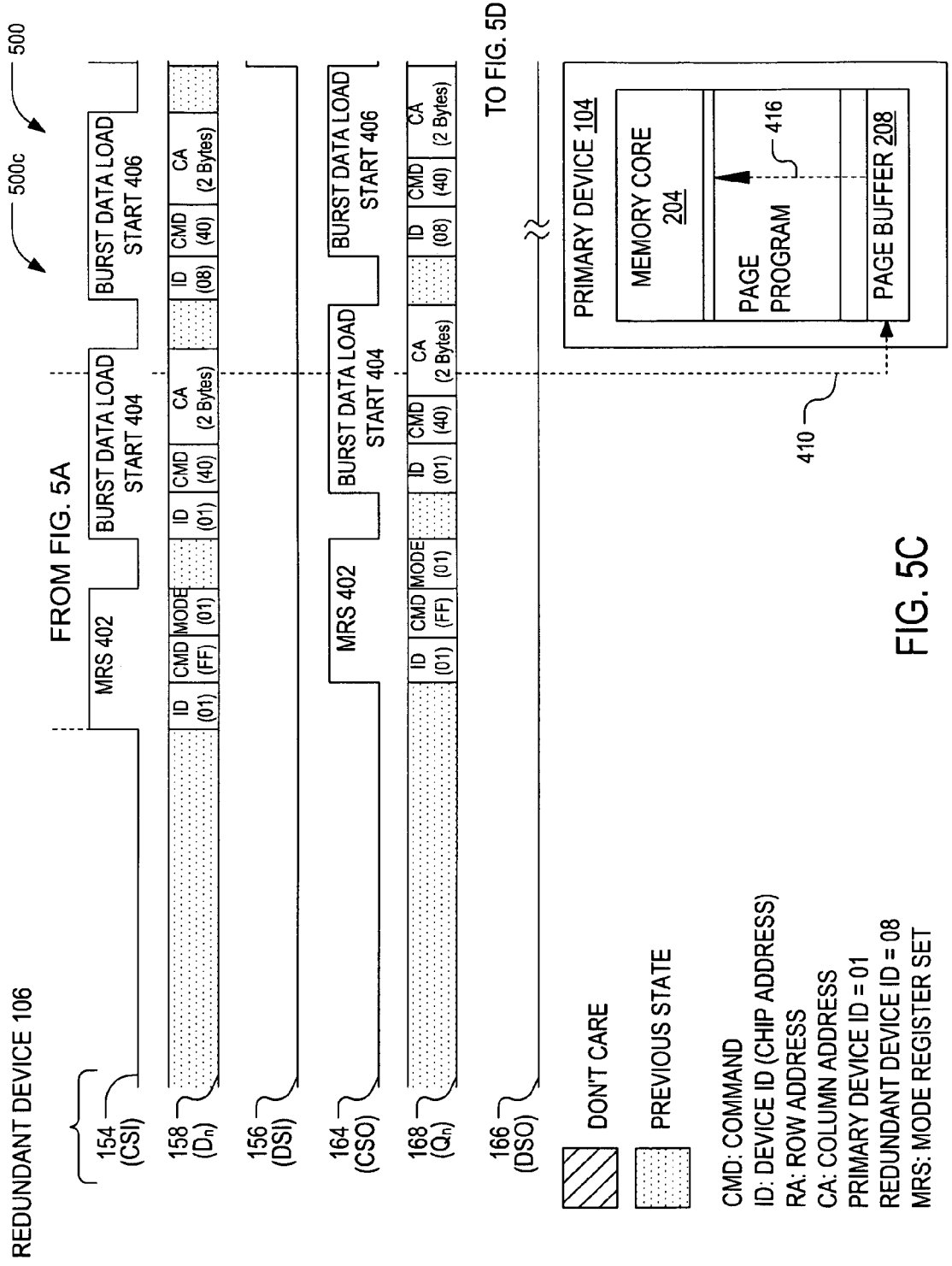
FIG. 5C is a third section of a timing diagram the data mirroring operation using the memory system shown in FIG. 1.
Figure 5D:
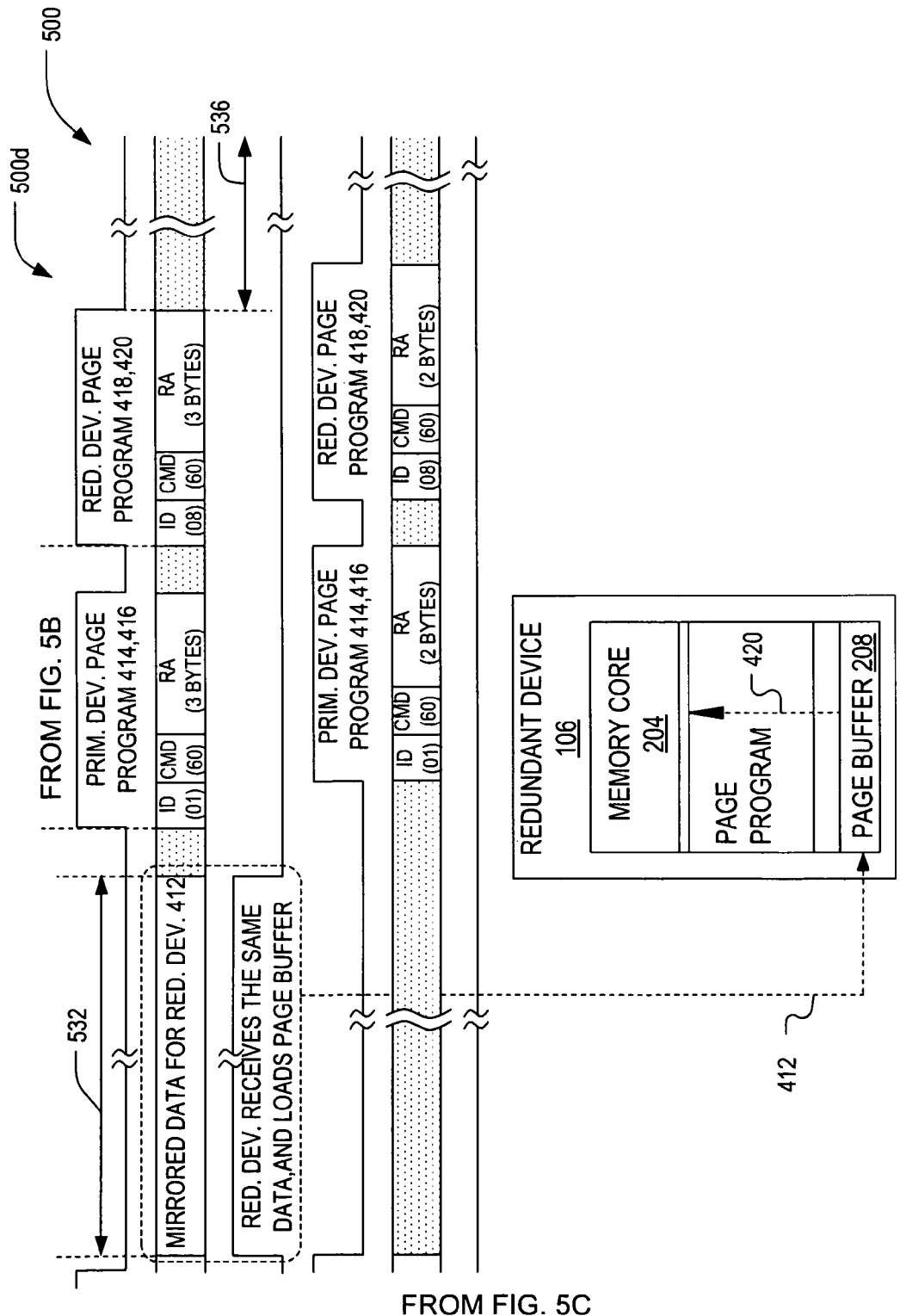
FIG. 5D is a fourth section of a timing diagram the data mirroring operation using the memory system shown in FIG. 1.

Referring now to FIGS. 5A to 5D, there is shown a timing diagram 500 of the system 100 shown in FIG. 1 executing the method shown in FIGS. 3, 4A, and 4B. A first section 500a of the flowchart 500 is shown in FIG. 5A, a second section 500b of the flowchart 500 is shown in FIG. 5B, a third section 500c of the flowchart 500 is shown in FIG. 5C, and a fourth section 500d of the flowchart 500 is shown in FIG. 5D. A legend 501 in FIG. 5A shows an arrangement of the first 500a, second 500b, third 500c, and fourth 500d sections of the timing diagram 500.

At time $T_0$ 502, the memory controller 108 sends a MRS (MODE REGISTER SET) command packet 402 to the primary memory device 104 (device ID encoded as 01 in this example) and it receives the MODE REGISTER SET command packet 402 so that it activates the bypass function. It is noted that MRS packet itself contains mode register value after CMD (encoded as FF in this example). This MRS packet is also bypassed to the down stream direction through CSO 144 and $Q_n$ 148 signals.

At time $T_1$ 504, the primary memory device 104 receives the Burst Data Load Start command (encoded as 40 in this example) packet 410. This command packet is also bypassed to the downstream.

At time $T_2$ 508, the memory controller 108 issues a Burst Data Load Start command packet 406 for the redundant memory device 106. Later (seven clock cycles in this example), at time $T_{2a}$ 514, the redundant memory device 106 receives the Burst Data Load Start command packet 406, than prepares to receive a Write Data Packet since the chip ID (encoded as 08 in this example) matches. Therefore both the primary memory device 104 and the redundant memory device 106, entered into Write mode, and expect to receive one or more Write Data Packets.

At time $T_3$ 512, the memory controller 108 issues a Write Data Packet to the primary memory device 104. During the time period denoted by numeral 530 the primary memory device 104 receives and latches the incoming Write Data Packet (data) into its Page Buffer 208. And also, in one clock cycle latency, the Write Data Packet continues to be flow-through via $Q_n$ & DSO ports of the primary device 104.

At time $T_{3a}$ 516, the redundant memory device 106 receives the same Write Data Packet (data), and starts to fill its Page Buffer with the incoming write data packet during the time period denoted by numeral 532.

At time $T_4$ 520, the memory controller 108 issues Page Program command packet for the primary memory device 104. During the time period denoted by numeral 534 the primary device 104 performs the page program operation 416.

At time $T_5$ 522, the memory controller 108 issues another Page Program command packet for the redundant memory device 106. The primary memory device 104 programs the given data into the designated page location in memory core, and also the redundant memory device 106 programs 420 the same data into its designated page location in memory core for mirroring purpose during the time period denoted by numeral 536.

Figure 7:
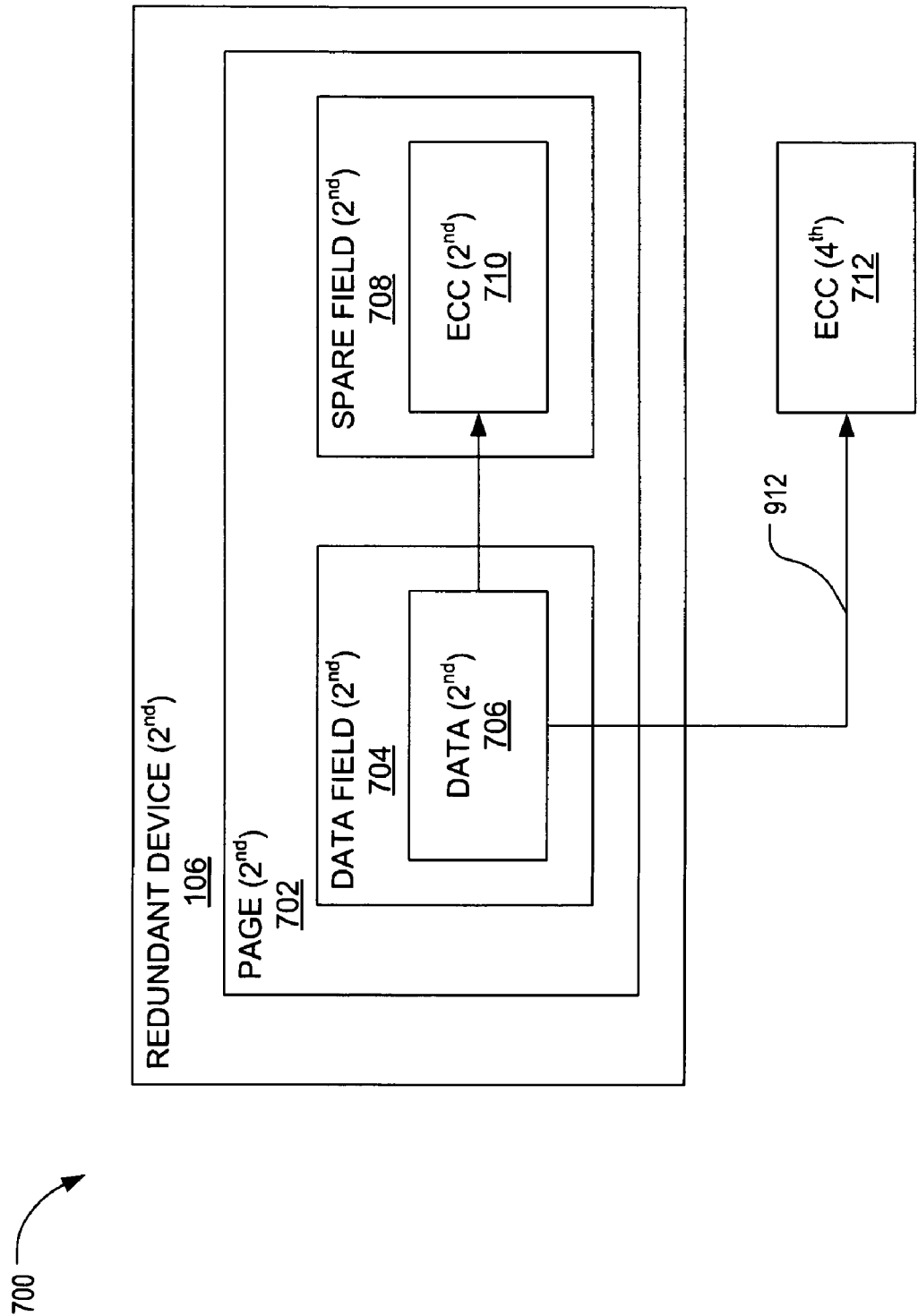
FIG. 7 is a block diagram of the redundant device shown in FIG. 1 and a fourth ECC.

Referring now to the block diagrams in FIGS. 6 and 7, the present invention provides a method of reading a page in the serial-connected memory system shown in FIG. 1 having at least the primary (first) memory device 104 including first data 606 within a first data field 604 within a first page 602 and a first error correction code (ECC) 610 within a first spare field 608 within the first page 602; and the redundant (second) memory device 106 including second data 706 within a second data field 704 within a second page 702 and a second ECC 710 within a second spare field 708 within the second page 702. The second data 706 within the second data field 704 is a mirrored version of the first data 606 within the first data field 604 in accordance with the method of data mirroring describe herein above.

The pages 602,702 may include, for example, 2048 byte data fields 604,704 divided into four 512 byte data 606,706 (one shown for clarity). The spare fields 608,708 may include, for example, 64 bytes wherein 3 bytes are used for storing an ECC 610,710 generated from each respective 512 byte data 606,706 in the data fields 604,704. The remaining 52 bytes within the spare fields 608,708 may be used for other functions such as wear leveling. The ECC's 610,710 may be generated in accordance with methods known in the art such as Hamming Algorithm, Reed-Soloman Algorithm, or BCH (Bose, Ray-Chaudhuri, Hocquenghem) Algorithm.

Figure 9A:
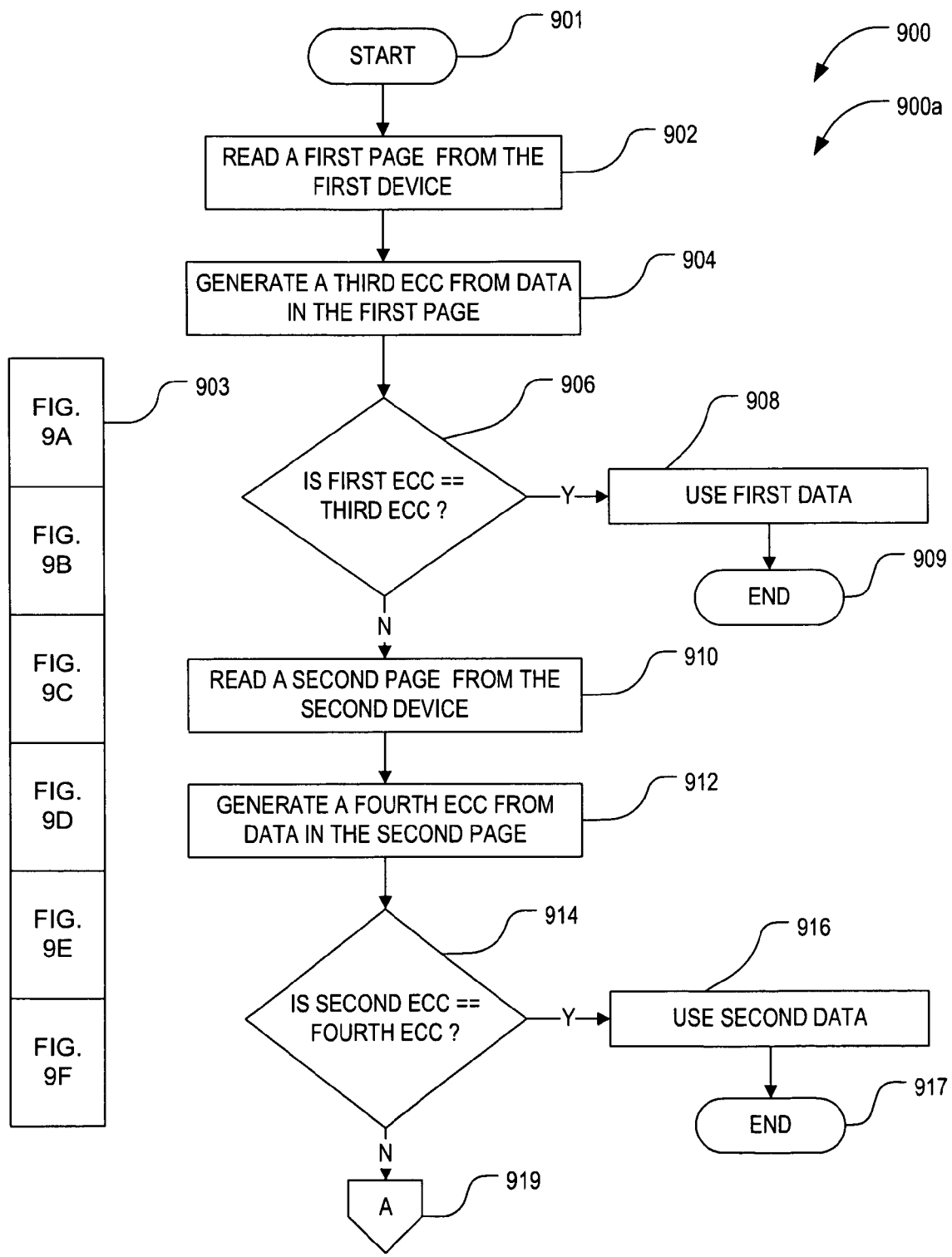
FIG. 9A is a first section of a flowchart of a method of reading a page in the system shown in FIG. 1.
Figure 9B:
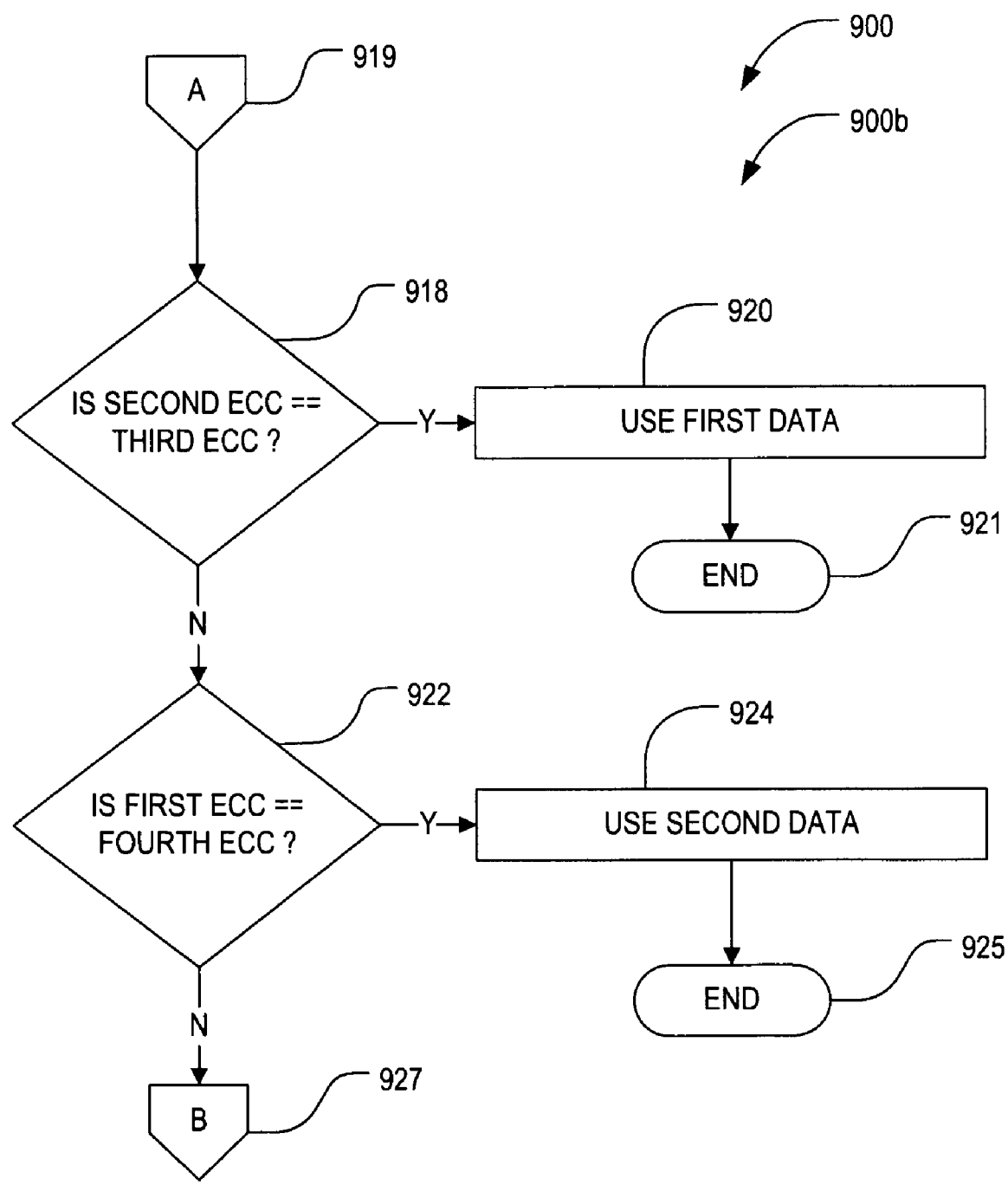
FIG. 9B is a second section of a flowchart of the method of reading a page in the system shown in FIG. 1.
Figure 9C:
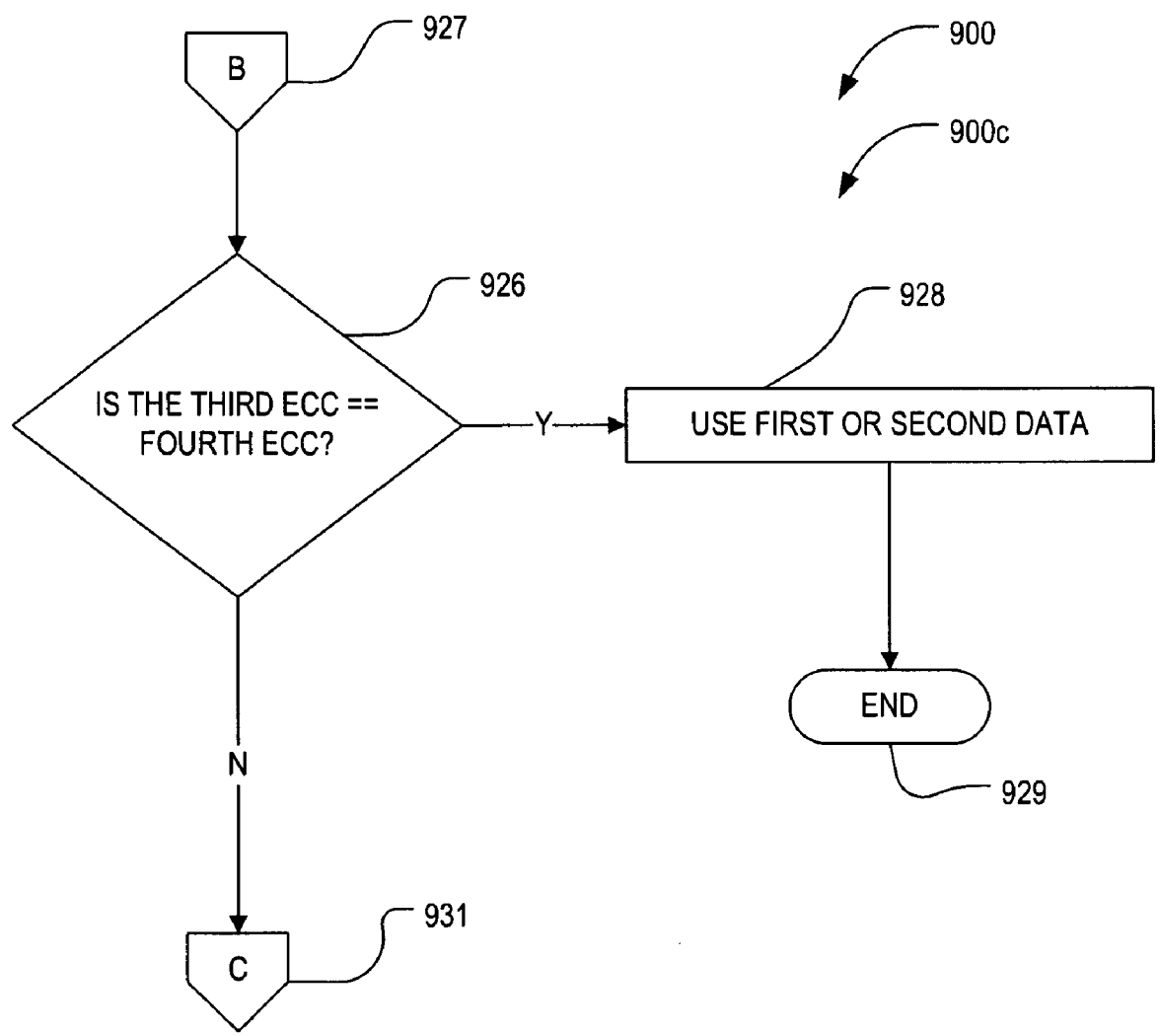
FIG. 9C is a third section of a flowchart of the method of reading a page in the system shown in FIG. 1.
Figure 9D:
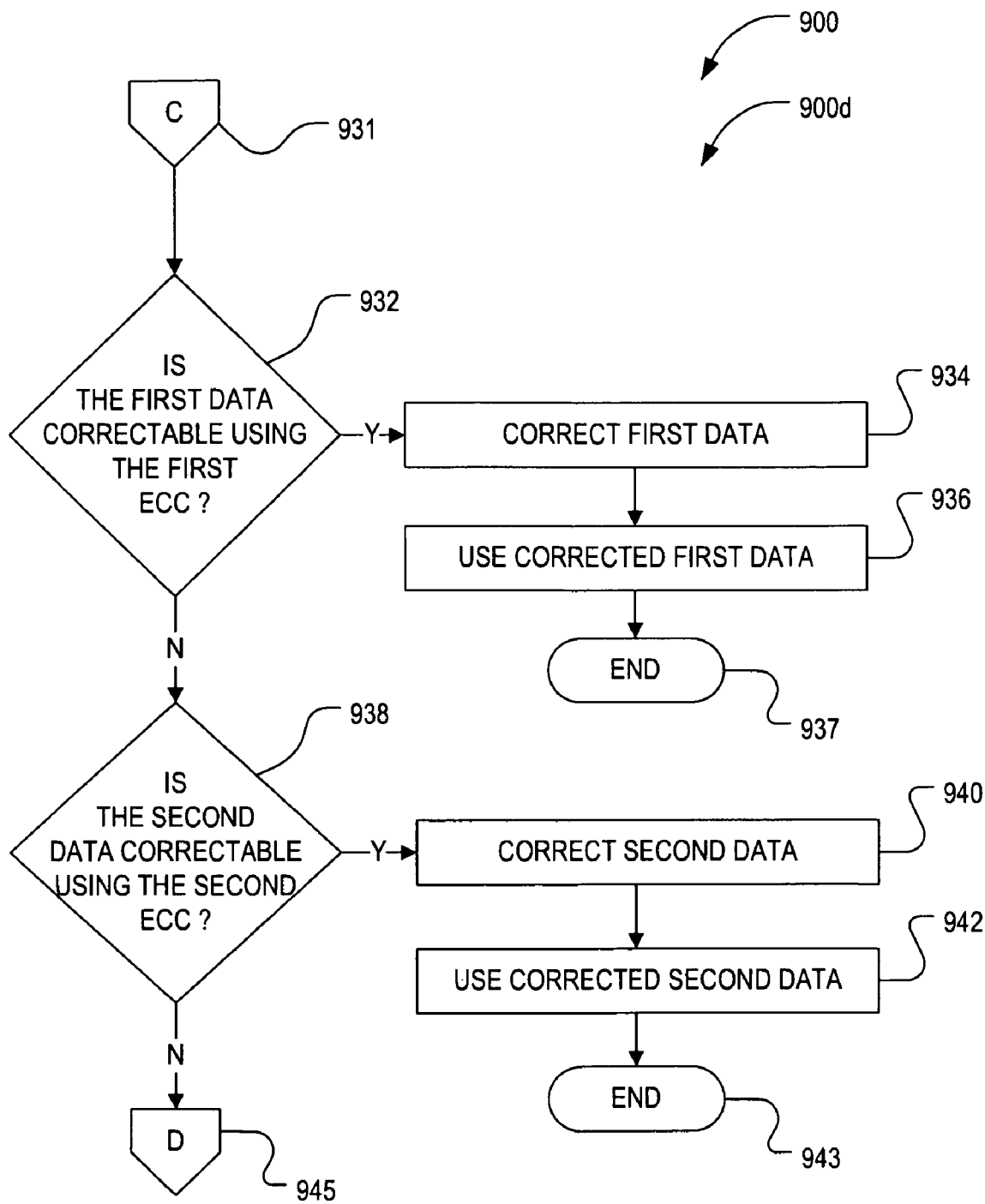
FIG. 9D is a fourth section of a flowchart of the method of reading a page in the system shown in FIG. 1.
Figure 9E:
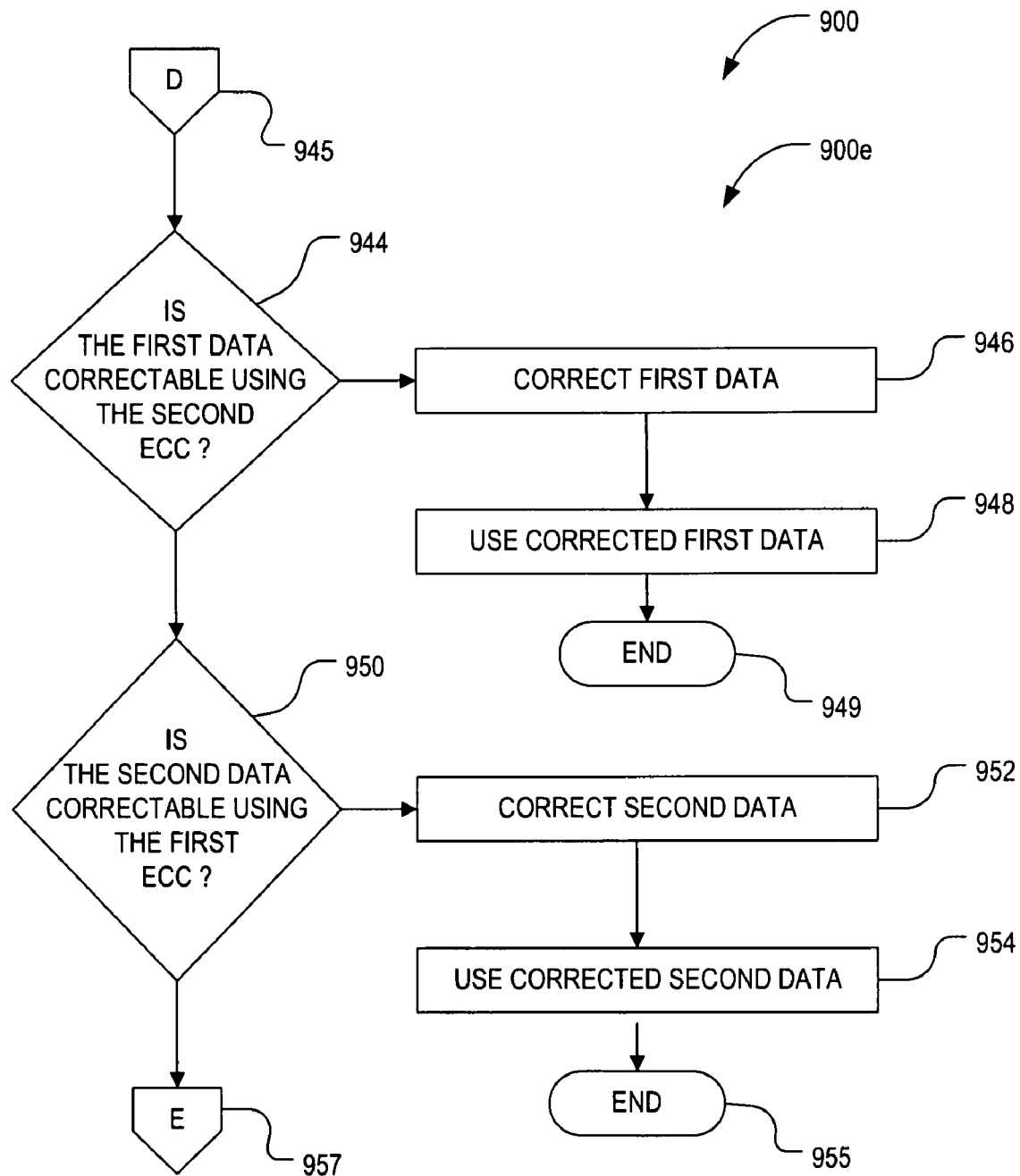
FIG. 9E is a fifth section of a flowchart of the method of reading a page in the system shown in FIG. 1.
Figure 9F:
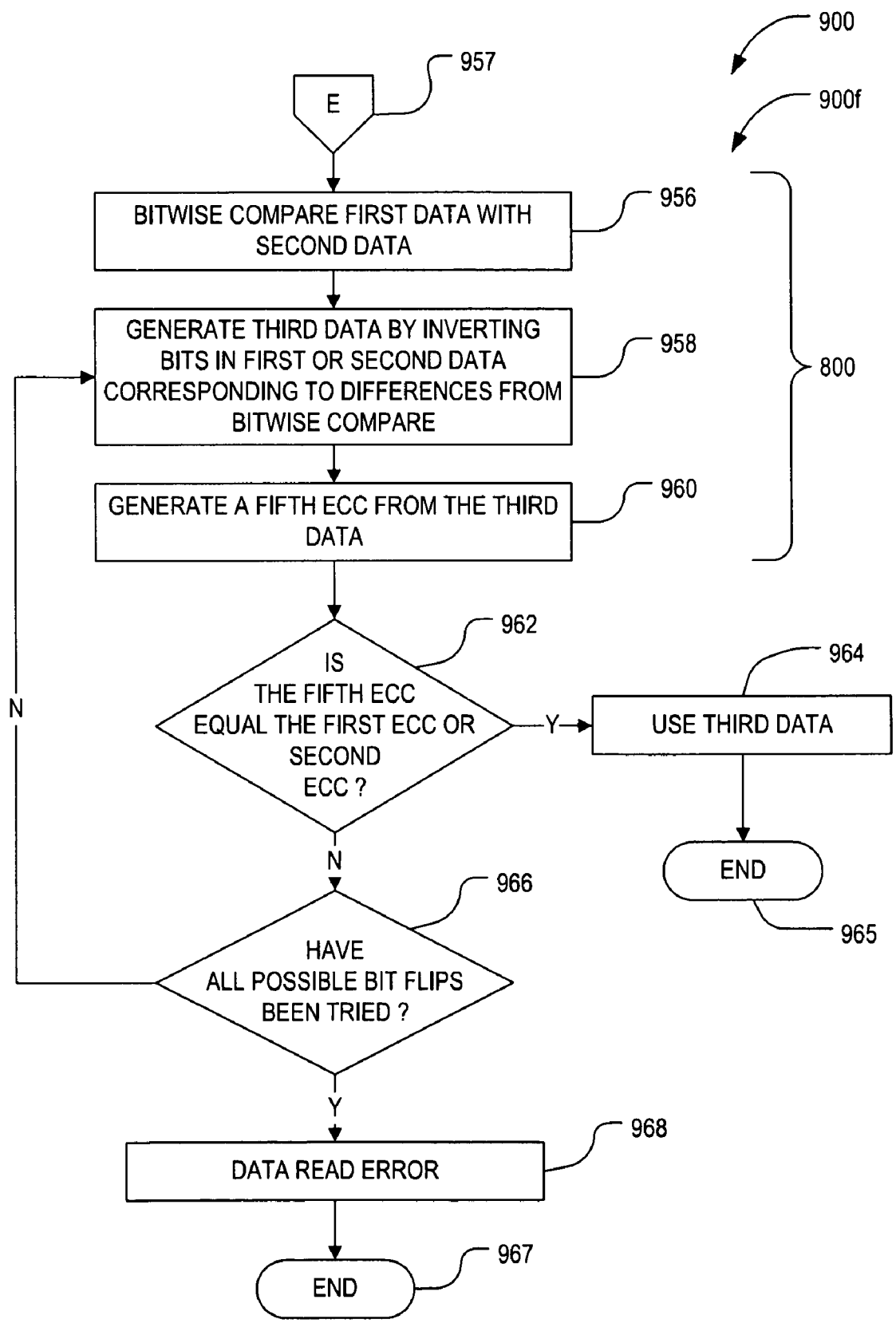
FIG. 9F is a sixth section of a flowchart of the method of reading a page in the system shown in FIG. 1.

Referring now to FIG. 9A, there is shown a flowchart 900 illustrating steps of a method for reading in a serial-connected memory system. A first section 900a of the flowchart 900 is shown in FIG. 9A, a second section 900b of the flowchart 900 is shown in FIG. 9B, a third section 900c of the flowchart 900 is shown in FIG. 9C, a fourth section 900d of the flowchart 900 is shown in FIG. 9D, a fifth section 900e of the flowchart 900 is shown in FIG. 9E, and a sixth section 900f of the flowchart 900 is shown in FIG. 9F. The first section 900a of the flowchart 900 is logically connected to the second section 900b of the flowchart 900 at connector A 919. The second section 900b of the flowchart 900 is logically connected to the third section 900c of the flowchart 900 at connector B 927. The third section 900c of the flowchart 900 is logically connected to the fourth section 900d of the flowchart 900 at connector C 931. The fourth section 900d of the flowchart 900 is logically connected to the fifth section 900e of the flowchart 900 at connector D 945. The fifth section 900e of the flowchart 900 is logically connected to the sixth section 900f of the flowchart 900 at connector E 957.

Upon startup 901, the first page 602 is read 902 from the primary memory device 104 in accordance with methods described in patent application to Oh, supra. Then the third ECC 612 is generated 904 from the first data 606.

Next, the first ECC 610 is compared 906 with the third ECC 612. If the third ECC 612 and the first ECC 610 are equal then the first data 606 can be used 908. This condition occurs when there are no errors in the first data 606 and the first ECC 610.

If the third ECC 612 and the first ECC 610 are not equal then the second page 702 is read 910 from the redundant device 106. Then a fourth ECC 712 is generated 912 from the second data 706. If the fourth ECC 712 and the second ECC 710 are equal then the second data 706 can be used 916. This condition occurs when there are no errors in the second data 706 and the second ECC 710.

Referring now to FIG. 9B, if the fourth ECC 712 and the second ECC 710 are not equal then the second ECC 710 is compared 918 with the third ECC 612. If the third ECC 612 and the second ECC 710 are equal then the first data 606 can be used 920. This condition occurs when there are no errors in the first data 606 and the second ECC 710 but there may be an error in the first ECC 610.

If the third ECC 612 and the second ECC 710 are not equal then the first ECC 610 is compared 922 with the fourth ECC 712. If the first ECC 610 and the fourth ECC 712 are equal then the second data 706 can be used 924. This condition occurs when there are no errors in the second data 706 and the first ECC 710 but there may be an error in the second ECC 710.

Referring now to FIG. 9C, if the first ECC 610 and the fourth ECC 712 are not equal then the third ECC 612 is compared 926 with the fourth ECC 712. If the third ECC 612 and the fourth ECC 712 are equal then the first data 606 or second data 706 can be used 928. This condition occurs if there are no errors in the first data 606 and the second data 706 but there may be errors in the first ECC 610 and the second ECC 710. This step 926 is equivalent to comparing the first data 606 with the second data 706.

Referring to FIG. 9D, the comparison of step 906 may indicate 932 that an error in the first data 606 may be corrected using the first ECC 610. Then the first data 606 is corrected 934 and the corrected first data is used 936.

The comparison of step 914 may indicate 938 that an error in the second data 706 may be corrected using the second ECC 710. Then the second data 706 is corrected 940 and the corrected second data is used 942.

Referring to FIG. 9E, the comparison of step 918 may indicate 944 that an error in the first data 606 may be corrected using the second ECC 710. Then the first data 606 is corrected 946 and the corrected first data is used 948.

The comparison of step 922 may indicate 950 that an error in the second data 706 may be corrected using the first ECC 610. Then the second data 706 is corrected 952 and the corrected second data is used 954.

Figure 8:
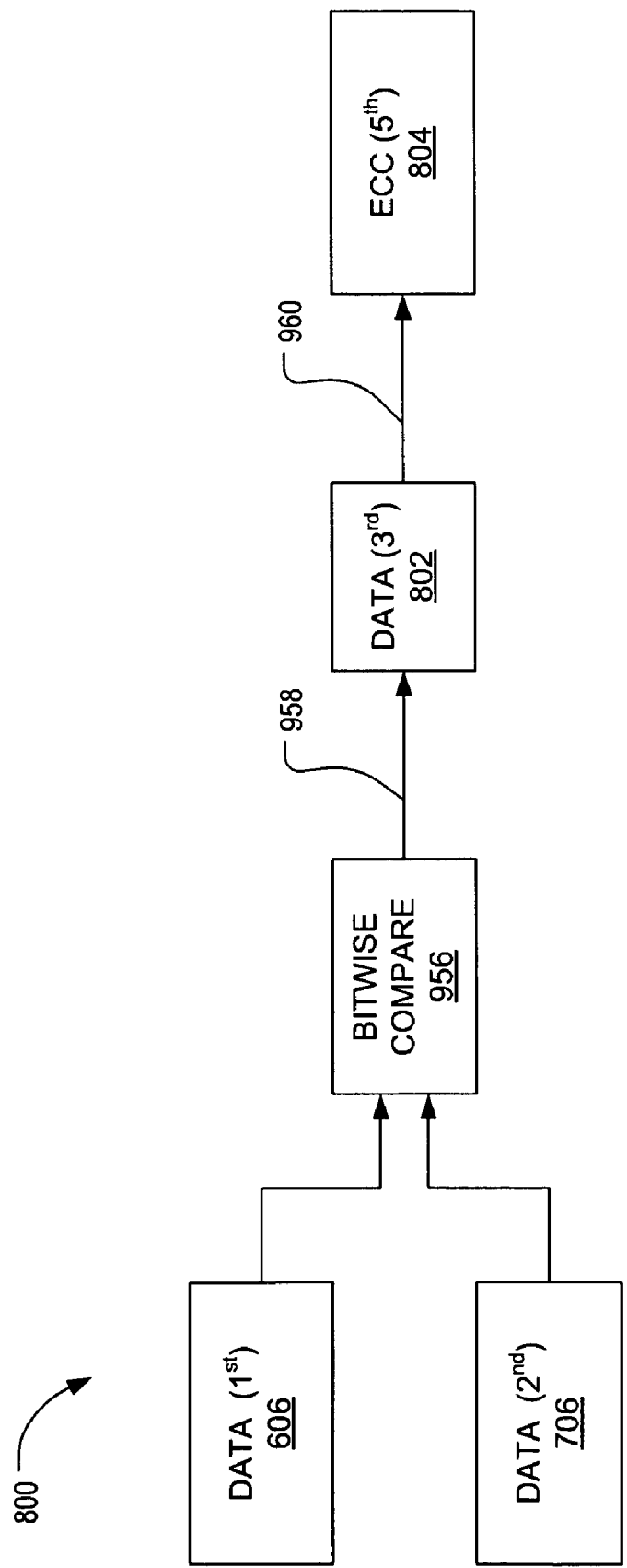
FIG. 8 is a block diagram of the first data shown in FIG. 6, the second data shown in FIG. 7, and means for generating a fifth ECC.

Next, referring to FIGS. 8 and 9F, the first data 606 and the second data 706 are bitwise compared. This indicates positions where errors are most probably occurred if positions of the errors are uncorrelated. A number of errors indicated by step 956 may be small enough that correct data can be recovered by a trial and error algorithm. For example, if 4 differences and hence errors are detected in step 956, which is too many to recover from conventional error correction means, then only up to 16 different trials according the present invention need to be attempted. Next, a third data 802 is generated 958 from the first data 606 or second data 706 and a fifth ECC 804 is generated 960 from the third data 802. If the fifth ECC 804 is equal to the first ECC 610 or the second ECC 710 then use 964 the third data 802. Steps 958,960, and 962 are repeated 966 until the fifth ECC 804 is equal to the first ECC 610. After all trials are exhausted a data read error is declared 968.

It should be noted that when comparing ECC's such as in steps 906,914,918,922,926, and 962, the comparison may also provide an indication whether a correctable or uncorrectable error has occurred in the data or in the ECC itself and those skilled in the art will recognize that the order of the steps may be reordered based on these indications and still be within the invention. As well, each of the above reference steps 906,914,918,922,926, and 962 may be used individually or in any combination and still be within the scope of the present invention.

The present invention can be applied to any kind of solid state memory system such as NAND Flash EEPROM (Electrically Erasable Programmable Read Only Memory), NOR Flash EEPROM, AND Flash EEPROM, DiNOR (Divided Bit Line NOR) Flash EEPROM, Serial Flash EEPROM, DRAM (Dynamic Random Access Memory), SRAM, ROM (Read Only Memory), EPROM (Erasable Programmable Read Only Memory), FRAM (Ferromagnetic RAM), MRAM (Magnetic RAM), PCRAM (Phase Change RAM) or the like.

The present invention therefore provides a method and apparatus for faster data mirroring implementing a fully serialized high speed serial link of input and output pins and dedicated control signals for the enabling and disabling of command/address packet and write data packet respectively. Thus providing a memory system controller having a flexible data mirroring operation between memory devices in a serial-connected memory system.

The present invention is especially useful for implementing an effective RAID1 (redundant array of independent disks) system having a fully serialized high speed serial link of in/out pins along with dedicated control signals for the enabling and disabling of command/address packet and write data packet respectively. This flash based SSD system provides a system controller the maximum flexibility of data management in between different memory locations in the serial-connected flash based SSD system.

The embodiments of the invention described above are intended to be exemplary only. The scope of the invention is therefore intended to be limited solely by the scope of the appended claims.

We claim:

1. A method of data mirroring between a first and a second memory device in a serial-connected memory system, the method comprising:
   providing a bypass command to the first memory device;
   providing a write data packet to the first and second memory devices, wherein the write data packet is passed to the second memory device through the first memory device; and
   providing a write data packet command to the first and second memory devices,
   wherein the bypass command includes:
      a mode register set command for setting a bypass mode of the first memory device;
      a first burst data load command for setting a column address of the first memory device; and
      a second burst data load command for setting a column address of the second memory device,
   thereby mirroring the write data packet between the first and second memory devices.

2. The method as claimed in claim 1, wherein providing the bypass command to the first memory device comprises enabling a bypass function of the first memory device.

3. The method as claimed in claim 1, wherein providing the write data packet to the first and second memory devices comprises:
   providing a receive start command to the first memory device; and
   providing a receive start command to the second device.

4. The method as claimed in claim 1, wherein providing the write data packet to the first and second memory devices comprises:
   receiving the write data packet in the first memory device;
   bypassing the write data packet through the first memory device; and
   receiving the write data packet in the second memory device.

5. The method as claimed in claim 4, wherein receiving the write data packet in the first memory device comprises loading the write data packet into a page buffer within the first memory device.

6. The method as claimed in claim 4, wherein receiving the write data packet in the second memory device comprises loading the write data packet into a page buffer within the second memory device.

7. The method as claimed in claim 1, wherein providing a write data packet command to the first and second memory devices comprises:
   providing a first page program command to the first memory device; and
   providing a second page program command to the second memory device.

8. The method as claimed in claim 7, further comprising:
   checking a status of the first page program command; and
   checking a status of the second page program command.

9. The method as claimed in claim 2, further comprising disabling the bypass function of the first memory device.

10. The method as claimed in claim 1, wherein providing a write data packet comprises generating an error correction code (ECC) from data within a data field within the write data packet and storing the ECC in a spare field within the write data packet.

11. A memory system comprising:
   a plurality of serial-connected memory devices, including a first memory device and a second memory device, and
   a memory controller for:
      providing a bypass command to the first memory device;
      providing a write data packet to the first memory device and bypassing the write data packet to the second memory device, wherein the write data packet is passed to the second memory device through the first memory device; and
      providing a write command to the first and second memory devices for mirroring the write data packet written in the first second memory device in the second memory device,
   wherein the bypass command comprises:
      a mode register set command for setting a bypass mode of the first memory device;
      a first burst data load command for setting a column address of the first memory device; and
      a second burst data load command for setting a column address of the second memory device.

12. The memory system as claimed in claim 11, wherein the plurality of serial-connected memory devices and the memory controller comprise a daisy-chain topology.

13. The memory system as claimed in claim 11, wherein the plurality of serial-connected memory devices and the memory controller comprise a ring topology.

14. A memory system comprising:
   a plurality of serial-connected memory devices, including a first memory device and a second memory device, and
   a memory controller for:
      providing a bypass, command to the first memory device;
      providing a write data packet to the first memory device and bypassing the write data packet to the second memory device, wherein the write data packet is passed to the second memory device through the first memory device; and
      providing a write command to the first and second memory devices for mirroring the write data packet written in the first second memory device in the second memory device, wherein each of the serial-connected memory devices comprises:
a first link for inputting one or more packets into the memory device;
a first input for inputting a command strobe signal into the memory device, the command strobe signal for delineating a first packet input into the memory device by the first data link, the first packet containing a command for executing by the memory device;
a second input for inputting a data strobe signal into the memory device, the data strobe signal for delineating a second packet input into the memory device by the first data link, the second packet containing data for storing in the memory device;
a first output for outputting the command strobe signal from the memory device;
a second output for outputting the data strobe signal from the memory device; and
a second link for:
outputting the first packet from the memory device while the command strobe signal is output from the memory device at the output, and
outputting the second packet from the memory device while the data strobe signal is output from the memory device at the output.

15. The memory system as claimed in claim 11, wherein the first and second memory devices each comprise a page buffer for receiving the write data packet.

16. The memory system as claimed in claim 11, wherein the write command comprises:
a first page program command for setting a row address of the first memory device; and
a second page program command for setting a row address of the second memory device.

17. The memory system as claimed in claim 11, wherein providing a write data packet comprises generating an error correction code (ECC) from data within a data field within the write data packet and storing the ECC in a spare field within the write data packet.

18. A solid-state disk drive comprising:
a plurality of serial-connected memory devices, including a first memory device and a second memory device, and
a memory controller for:
providing a bypass command to the first memory device;
providing a write data packet to the first memory device and bypassing the write data packet to the second memory device, wherein the write data packet is passed to the second memory device through the first memory device; and
providing a write command to the first and second memory devices for mirroring the write data packet written in the first second memory device in the second memory device,
wherein the bypass command includes:
a mode register set command for setting a bypass mode of the first memory device;
a first burst data load command for setting a column address of the first memory device; and
a second burst data load command for setting a column address of the second memory device.

19. The solid-state disk drive as claimed in claim 18, wherein the memory controller further comprises means for providing an interface between the plurality of serial-connected memory devices and an external apparatus.

20. The solid-state disk drive as claimed in claim 19, wherein a type of the interface is chosen from a list consisting of: USB (Universal Serial Bus), SD (Secure Digital), CF (Compact Flash), and AHCI (Advanced Host Controller Interface).

21. The solid-state disk drive as claimed in claim 19, wherein a format of the solid-state disk drive is chosen from a list consisting of: FAT (File Allocation Table), NTFS (New Technology File System), JFFS (Journaling Flash File System), YAFFS (Yet Another Flash File System), and ZFS (Zettabyte File System).

22. A method of reading in a serial-connected memory system having at least a first memory device including data within a first data field within a first page and a first error correction code (ECC) within a first spare field within the first page; a second memory device including data within a second data field within a second page and a second ECC within a second spare field within the second page; and wherein the data within the second data field is a mirrored version of the data within the first data field, the method comprising:
reading the first page from the first memory device;
generating a third ECC from the data within the first data field;
comparing the first ECC with the third ECC;
reading the second page from the second memory device;
generating a fourth ECC from the data within the second data field;
comparing the second ECC with the fourth ECC;
bitwise comparing the data from the first data field with the data from the second data field;
generating a third data field by inverting a bit of the data from the first or second data field corresponding to the bitwise comparison;
generating a fifth ECC from the third data field; and
comparing the fifth ECC with the first or second ECC.

23. The method of reading in a serial-connected memory system as claimed in claim 22, further comprising:
comparing the second ECC with the third ECC.

24. The method of reading in a serial-connected memory system as claimed in claim 22, further comprising:
comparing the first ECC with the fourth ECC.

25. The method of reading in a serial-connected memory system as claimed in claim 22, further comprising:
comparing the third ECC with the fourth ECC.

26. The method of reading in a serial-connected memory system as claimed in claim 22, further comprising:
correcting the data within the first data field using the first ECC.

27. The method of reading in a serial-connected memory system as claimed in claim 22, further comprising:
correcting the data within the second data field using the second ECC.

28. The method of reading in a serial-connected memory system as claimed in claim 22, further comprising:
correcting the data within the first data field using the second ECC.

29. The method of reading in a serial-connected memory system as claimed in claim 22, further comprising:
correcting the data within the second data field using the first ECC.

* * * * *